United States Patent [19]
Hsu et al.

[11] Patent Number: 5,891,782
[45] Date of Patent: Apr. 6, 1999

[54] METHOD FOR FABRICATING AN ASYMMETRIC CHANNEL DOPED MOS STRUCTURE

[75] Inventors: Sheng Teng Hsu; Jong Jan Lee, both of Camas, Wash.

[73] Assignees: Sharp Microelectronics Technology, Inc., Camas, Wash.; Sharp Kabushiki Kaisha, Osaka, Japan

[21] Appl. No.: 918,678

[22] Filed: Aug. 21, 1997

[51] Int. Cl.⁶ .................................................. H01L 21/8234
[52] U.S. Cl. ......................... 438/302; 438/305; 438/289; 438/290; 438/291; 438/525; 438/766
[58] Field of Search .................................. 438/302, 305, 438/525, 766, 289, 290, 291

[56] References Cited

U.S. PATENT DOCUMENTS

| | | | |
|---|---|---|---|
| 5,403,758 | 4/1995 | Yoshihara | 438/366 |
| 5,436,175 | 7/1995 | Nakato et al. | 438/766 |
| 5,510,279 | 4/1996 | Chien et al. | 438/302 |
| 5,648,672 | 7/1997 | Hasegawa et al. | 257/372 |
| 5,767,557 | 5/1998 | Kizilyalli | 257/403 |

OTHER PUBLICATIONS

Article entitled, "A High Performance 0.1μm MOSFET with Asymmetric Channel Profile" authored by Akira Hiroki, Shinji Odanaka, and Atsushi Hori, published in the 1995 IEEE, IEDM 95–439, pp. 17.7.1–17.7.4.

Article entitled, A New Asymmetrical Halo Source Gold Drain (HS–Gold) Deep Sub–Half–Micrometer n–MOSFET Design for Reliability and Performance, authored by Taqi N. Buti, Seiki Ogura, Nivo Rovedo and Kentaroh Tobimatsu, published in the IEEE Transactions on Electron Devices, vol. 38, No. 8, Aug. 1991, pp. 1757–1764.

Article entitled, "Potential Design and Transport Property of 0.1 μm MOSFET with Asymmetric Channel Profile", authored by Shinji Odanaka and Akira Hiroki in the IEEE Transactions on Electron Devices, vol. 44, No. 4, Apr. 1997, pp. 595–600.

*Primary Examiner*—Peter Toby Brown
*Assistant Examiner*—Edwin Oh
*Attorney, Agent, or Firm*—Gerald Maliszewski; David C. Ripma

[57] ABSTRACT

A method of forming a MOS transistor without a lightly doped drain (LDD) region between the channel region and drain is provided. The channel region is formed from a tilted ion implantation after the deposition of the gate oxide layer. The tilted implantation forms a relatively short channel length, with respect to the length of the gate electrode. The position of the channel is offset, and directly adjoins the source. The non-channel area under the gate, adjacent the drain, replaces the LDD region between the channel and the drain. This drain extension acts to more evenly distribute electric fields so that large breakdown voltages are possible. The small channel length, and eliminated LDD region adjacent the source, act to reduce resistance between the source and drain. In this manner, larger $I_d$ currents and faster switching speeds are obtained. A MOS transistor having a short, offset channel and drain extension is also provided.

16 Claims, 5 Drawing Sheets

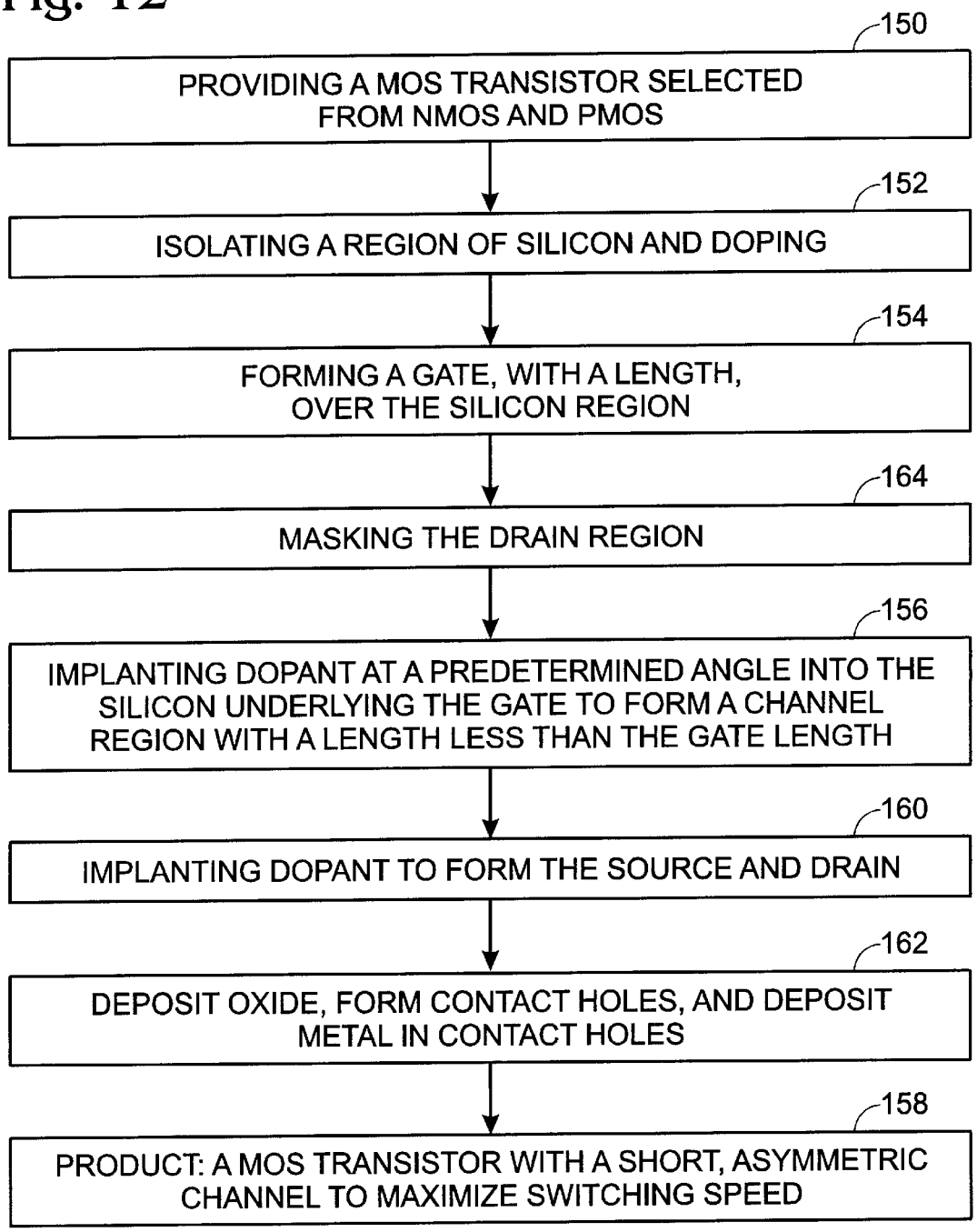

METHOD FOR FABRICATING AN ASYMMETRIC CHANNEL DOPED MOS STRUCTURE

This invention relates generally to semiconductor technology and, more specifically, to the formation of short, asymmetrical, channel regions in MOS transistors.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases, the dimensions of the source/drain/gate electrodes, and the channel region of each device, must decrease correspondingly.

When fabricating MOS transistors, the source and drain electrodes are typically heavily doped to reduce the parasitic resistance of the device. While the doping improves conductance, it increases parasitic capacitance, and lowers the breakdown voltage. Many prior art devices interpose lightly doped drain (LDD) regions on either side of the channel region, between the channel region and the source/drain electrodes. These LDD regions permit the MOS devices to develop adequate breakdown voltages. However, these LDD regions also increase the resistance between the source and drain when the transistor is turned on. This increased parasitic resistance degrades the switching speed and current carrying capabilities of the transistor. The necessity of LDD regions also adds process steps to fabrication which negatively affect both cost and reliability.

A MOS transistor suitable to control the gating and amplification of high speed signals must have a low parasitic capacitance, low parasitic resistance, and a breakdown voltage larger than the signals which are carried. These performance parameters represent design trade-offs well known to those skilled in the art of MOS transistor fabrication.

Most prior art MOS transistors have channel regions that are substantially the same size as the overlying gate electrode. The channel region size and shape is a direct result of implanting dopants in the silicon underlying the gate electrode to form source/drain electrodes and LDD regions, after the deposition of the gate electrode. The wide channel region formed in such a process contributes undesirable characteristics to a transistor's performance. It is commonly acknowledged that the drain current is inversely proportional to the length of the channel.

Procedures exist in the prior art to implant the area under the gate electrode with dopant to change performance characteristics of the transistor. A tilted ion implant is performed to insure a good overlay between the gate the source electrodes. That is, to insure a portion of the source electrode underlies the gate. A halo implant is typically performed in the eight sides surrounding a gate electrode to form an LDD region, preventing the occurrence of the short channel effect, or leakage current. However, these techniques have not been used to substantially change the size and position of the channel region underlying the gate electrode.

It would be advantageous to provide a MOS transistor with a large breakdown voltage that is fabricated without LDD regions between the channel region and the source and drain electrodes, thereby reducing the parasitic resistance of the transistor.

It would be advantageous to provide a MOS transistor with a shorter channel length to permit the conduction of larger drain currents.

It would be advantageous to provide a MOS transistor with a higher switching speed and drain current carrying capabilities.

It would be advantageous to provide a MOS transistor with fewer fabrication steps, fewer implantations of dopant, and fewer barrier structures to improve reliability and lower costs.

Accordingly, in the fabrication of a MOS transistor selected from the group consisting of NMOS and PMOS transistors, a method for forming a short, asymmetric channel region is provided comprising the steps of:

a) isolating a region of silicon, from which a source, a drain, and a channel region between the source and drain, are subsequently formed, and doping the region;

b) forming a gate electrode overlying the silicon region, the gate electrode having a length extending from the source to the drain, and vertical sidewalls adjoining the source and drain; and c) implanting ions of dopant at a predetermined angle, defined from the gate electrode vertical sidewall adjacent the source, into the silicon region underlying the gate to form a channel region having a length less than the gate length, the channel region extending from underneath the gate electrode vertical sidewall adjacent the source, toward the drain. The formation of a short channel length maximizes the transistor switching speed.

One aspect of the invention includes the additional step, after Step b), of masking the drain region to prevent the implantation of dopant ions during Step c). Step c) includes using an ion implantation angle in the range between 30° and 70° from the vertical sidewall of the gate electrode adjoining the source. Preferably, the ion implantation angle is approximately 60°.

A MOS transistor having an asymmetric, short channel region is also provided. The MOS transistor is selected from the group consisting of NMOS and PMOS transistors, and comprises an isolated silicon region including a source and a drain. The MOS transistor further comprises a gate electrode overlying the silicon region having a length extending from the source to the drain, and includes vertical sidewalls adjoining the source and drain. The MOS transistor comprises a silicon channel region having a channel length less than the gate length, underlying the gate and extending from underneath the gate electrode vertical sidewall adjoining the source, toward the drain. The channel region is formed by implanting ions of dopant at a predetermined angle, defined from the gate electrode vertical sidewall adjacent the source, into the channel region. The MOS transistor also comprises a silicon drain extension region extending underneath the gate from the channel region, to the drain. A short channel region is formed between said source and drain to minimize drain capacitance.

BRIEF DESCRIPTION OF THE DRAWINGS

FIG. 12 is a more detailed depiction of the flow chart of FIG. 11, illustrating the method of the present invention for forming a short, asymmetric channel region.

DETAILED DESCRIPTION OF THE PREFERRED EMBODIMENT

Figure 1:
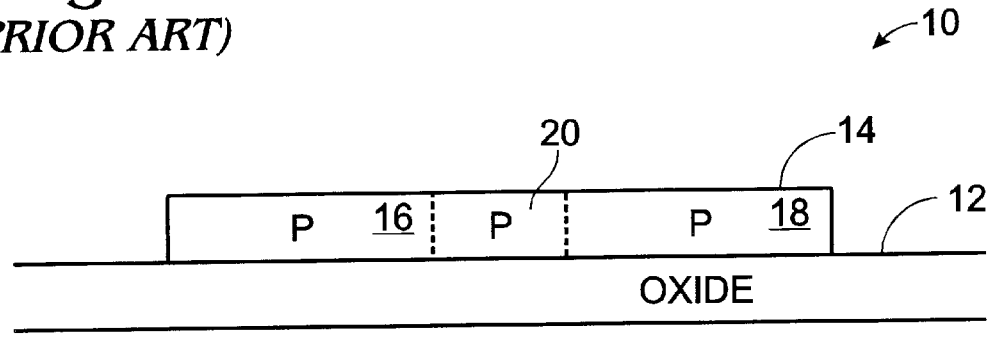
FIGS. 1–3 are partial cross-sectional views of steps in the completion of a MOS transistor (prior art).
Figure 2:
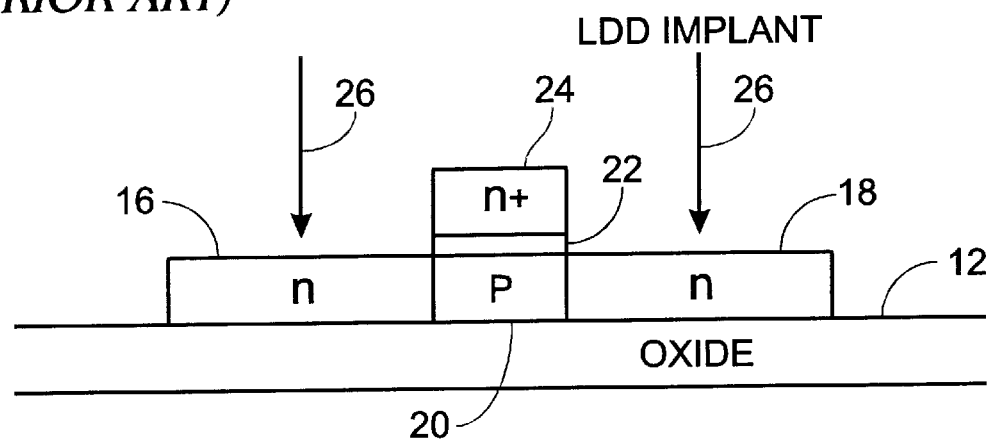
Figure 3:
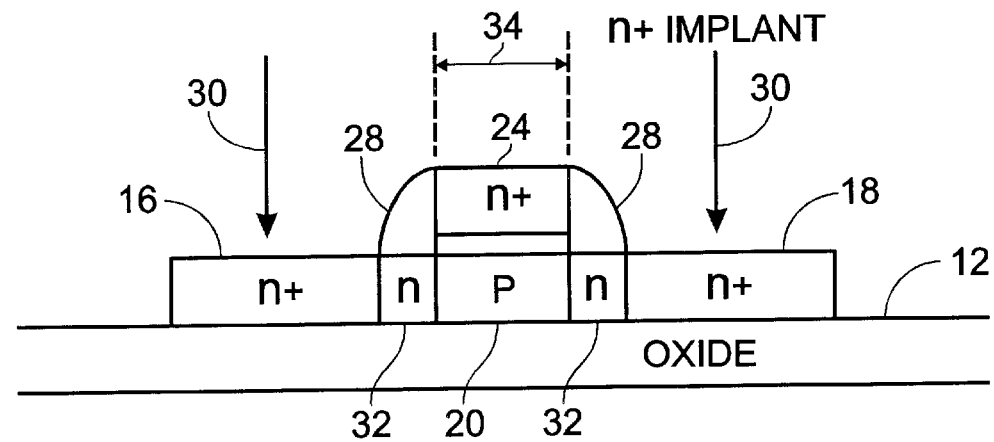

FIGS. 1–3 are partial cross-sectional views of steps in the completion of a MOS transistor 10 (prior art). In FIG. 1, transistor 10 is being fabricated from a SIMOX (separation by implantation of oxygen) substrate which includes an oxide layer 12 and an overlying silicon layer 14. Silicon layer 14 has, initially, been doped with a p type impurity. Silicon layer 14 is masked and etched to isolate it from other silicon regions of the integrated circuit (IC). Subsequently formed are a source 16, drain, 18, and a channel 20.

FIGS. 1–3 describe an NMOS type transistor 10. Alternately, the fabrication of a PMOS transistor can be described with essentially the same process. Both NMOS and PMOS transistor are also formed from bulk silicon, as opposed to SIMOX. In forming an NMOS transistor with bulk silicon, a well of p-doped silicon is formed in a substrate of n-type silicon material, from which the channel, source, and drain are subsequently formed. After the formation of a gate, the bulk silicon transistor is substantially the same as transistor 10 in FIG. 2. The following processes for the bulk silicon and SIMOX methods are essentially the same. In the interest of brevity, prior art methods for forming PMOS transistors, and MOS transistors fabricated from bulk silicon are not illustrated.

FIG. 2 is a cross-sectional view of transistor 10 of FIG. 1 following the deposition and etching of a gate oxide layer 22, and the deposition of a semiconductor material to form gate electrode 24. Gate electrode is heavily n+ doped. A lightly doped drain implantation (LDD) follows the formation of gate 24. The LDD implant is represented by arrows 26 directed to source 16 and drain 18. Gate 24 shields channel region 20 from implantation 26.

FIG. 3 is a cross-sectional view of transistor 10 of FIG. 2 following the formation of gate sidewalls 28. An n+ ion implantation represented by arrows 30 is directed toward source 16 and drain 18 to make these n+ regions. Sidewalls 28 shield a portion of source 16 and drain 18 adjacent channel 20 from n+implanting 30 to form LDD regions 32. As is well known in the art, LDD regions 32 act to distribute the electric field formed between the p and n+ regions, increasing the breakdown voltage between channel 20 and drain 18. Channel 20 and gate electrode 24 have substantially the same length, represented by reference designator 34. LDD regions 32 are important to maintain a high breakdown voltage, but the LDD regions 32 add resistance to the current path between source 16 and drain 18 and increase the time constant associated with switching the transistor.

Figure 4:
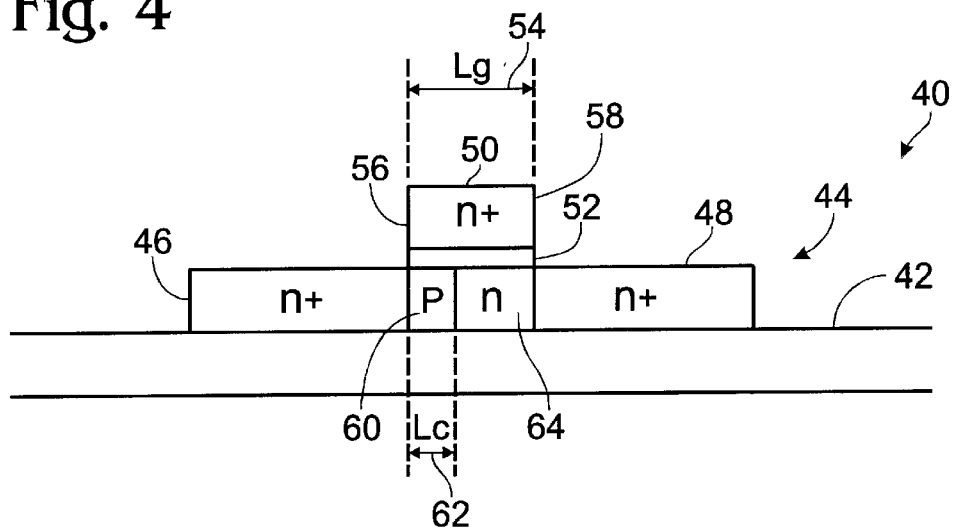
FIG. 4 is a partial cross-sectional view of an NMOS transistor having an asymmetric, short channel region.

FIG. 4 is a partial cross-sectional view of an NMOS transistor 40 having a short, asymmetric channel region. Transistor 40 includes an oxide layer 42, and overlying isolated silicon region 44. Silicon region 44 includes an n+ source 46 and an n+ drain 48. A gate electrode 50 overlies gate oxide layer 52 and silicon region 44, and has a length ($L_g$) 54 extending from source 46 to drain 48. In one aspect of the invention, gate electrode length 54 is less than approximately 0.5 microns. Gate electrode 50 also has vertical sidewalls 56 and 58 respectively adjoining source 46 and drain 48.

A p-silicon channel 60 having a length ($L_c$) 62 less than gate length 54, underlies gate 50 and extends from underneath gate electrode vertical sidewall 56 adjoining source 46, toward drain 48. An n-silicon drain extension region 64 extends underneath gate 50 from p-channel region 60, to drain 48. Short channel region 60 is formed between source 46 and drain 48 to minimize drain 48 capacitance. Drain extension 64, between channel region 60 and drain 48, permits a large breakdown voltage to develop. In some aspects of the invention, drain extension 64 is significantly longer than LDD region 32 between channel 20 and drain 18 in the prior art transistor 10 depicted in FIG. 3. Therefore, the breakdown voltage developed by the transistor of the present invention is significantly higher. Referring again to FIG. 4, the present invention completely eliminates an LDD region between channel 60 and source 46, which decreases the resistance between source 46 and drain 48 and the improves time constants associated with the switching speed of transistor 40.

Transistor 40 is shown with source 46, drain 48, channel 60, and drain extension 64 formed on a SIMOX silicon layer. The silicon layer is masked, and etched, to isolate region 44. Alternately, source 46, drain 48, channel 60, and drain extension 64 are formed on silicon from a bulk silicon substrate (not shown). When an NMOS transistor is formed from bulk silicon, a p-well is created in n-type bulk silicon, and a thin surface layer of silicon is n-doped. Alternately, a silicon area is isolated in p-type bulk silicon, and a thin n-doped surface layer is formed. This n-doped layer is substantially the same as isolated silicon region 44 in FIG. 4. Once isolated silicon region 44 is formed, the process steps for bulk silicon and SIMOX are essentially the same. The structures identified above, and in FIG. 4, are the same for transistor 40 when formed from bulk silicon.

Figure 5:
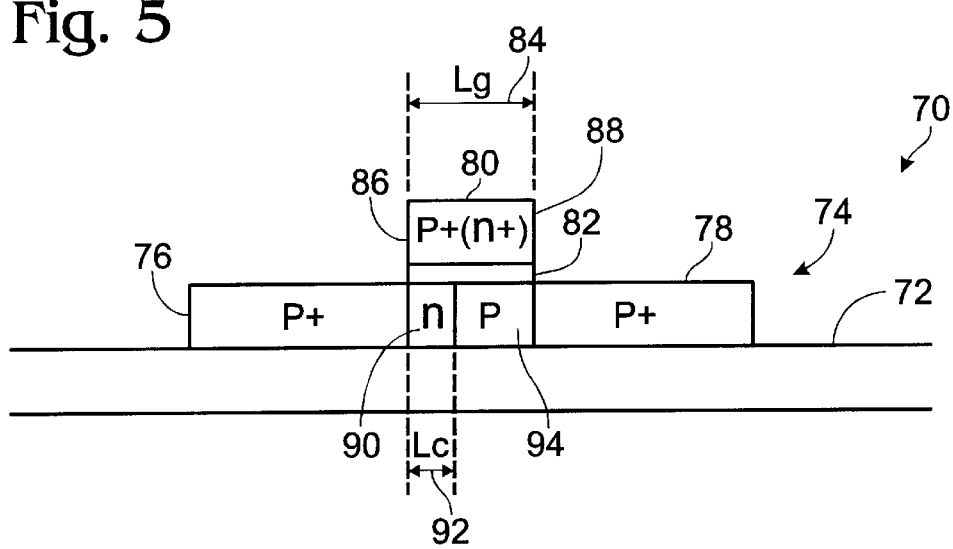
FIG. 5 is a partial cross-sectional view of a PMOS transistor having a short, asymmetric channel region.

FIG. 5 is a partial cross-sectional view of a PMOS transistor having a short, asymmetric channel region. Transistor 70 includes an oxide layer 72, and overlying isolated silicon region 74. Silicon region 74 includes a p+ source 76 and a p+ drain 78. A gate electrode 80 overlies gate oxide layer 82 and silicon region 74, and has a length ($L_g$) 84 extending from source 76 to drain 78. In one aspect of the invention, gate electrode length 84 is less than approximately 0.5 microns. Gate electrode 80 also has vertical sidewalls 86 and 88 respectively adjoining source 76 and drain 78. As is well known in the art, gate electrode 80 is fabricated with a polysilicon or other suitable material. PMOS transistor 70 fabricated with a p+ doped gate 80. Alternately, gate 80 is doped n+.

An n-doped silicon channel 90 has a length ($L_c$) 92 less than gate length 84, underlies gate 80 and extends from underneath gate electrode vertical sidewall 86 adjoining source 76, toward drain 78. A p-silicon drain extension region 94 extends underneath gate 80 from n-channel region 90, to drain 78. Short channel region 90 is formed between source 76 and drain 78 to minimize drain 78 capacitance. The exact doping densities of channel region 90 and drain extension 94 are varied to obtain a suitable threshold voltage and drain extension conductance in response to whether gate electrode 80 is doped p+ or n+.

Transistor 70 is shown with source 76, drain 78, channel 90, and drain extension 94 formed on a SIMOX layer. The silicon layer is masked, and etched to isolate region 74. Alternately, source 76, drain 78, channel 90, and drain extension 94 are formed from bulk silicon (not shown). That is, silicon region 74 is formed by p-doping an area of silicon overlying an n-well in p-type bulk silicon. Alternately, a layer in n-type bulk silicon is isolated and p-doped. This p-doped layer is substantially the same as isolated silicon region 74 in FIG. 5. Once isolated silicon region 74 is formed, the process steps for bulk silicon and SIMOX are essentially the same. The structures identified above, and in FIG. 5, are the same for transistor 70 when formed from bulk silicon.

Figure 6:
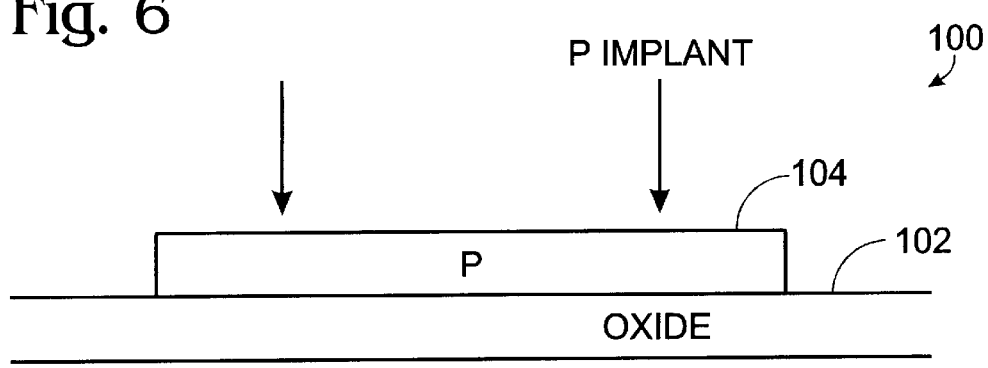
FIGS. 6–10 are partial cross-sectional views of steps in the formation of a completed MOS transistor 40 with a short, asymmetric channel region.

FIGS. 6–10 are partial cross-sectional views of steps in the formation of a completed MOS transistor with an asymmetric, short channel region. The MOS transistor is selected from the group consisting of NMOS and PMOS transistors. FIG. 6 is a partial cross-section view of a PMOS transistor 100. Transistor 100 is formed on a SIMOX substrate including an oxide layer 102 overlying isolated silicon region 104. Isolated silicon region 104 is implanted with impurities to form p-type silicon.

Alternately, PMOS transistor 100 is formed on an n-well of p-type bulk silicon, or on n-type bulk silicon, as described above in the discussion of FIG. 5. A thin layer of the n-type silicon is implanted with boron to form a p-layer substantially the same as silicon region 104. $BF_2$ is alternately used to form p-layer 104.

Figure 7:
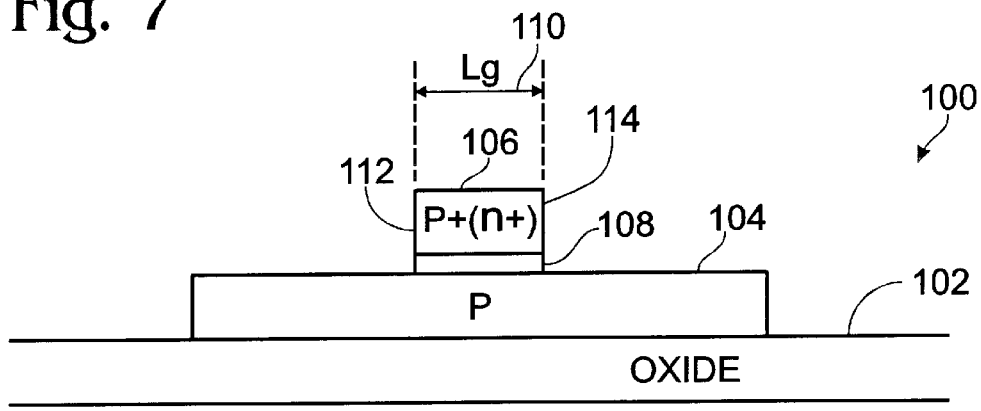

FIG. 7 is a partial cross-sectional view of transistor 100 of FIG. 6 with a gate electrode 106 and gate oxide layer 108 overlying silicon region 104. Gate electrode 106 has a length ($L_g$) 110 extending from the subsequently formed source to the subsequently formed drain. Gate electrode 106 also has a vertical sidewall 112 adjoining the subsequently formed source, and a vertical sidewall 114 adjoining the subsequently formed drain.

Figure 8:
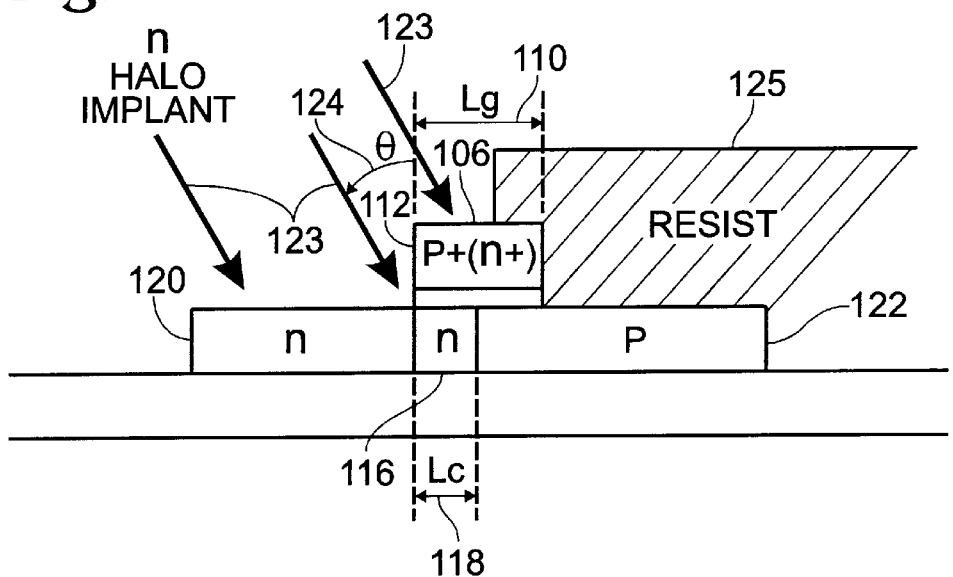

FIG. 8 is a partial cross-sectional view of transistor 100 of FIG. 7 with a silicon channel region 116 having a length ($L_c$) 118 less than gate length 110, underlying gate 106 and extending from underneath gate electrode vertical sidewall 112 adjoining source 120, toward drain 122. Channel region 116 is formed by implanting ions of dopant, represented by arrows 123, at an angle (θ) 124 defined from gate electrode vertical sidewall 112 adjacent source 120, into channel region 116.

Tilted angle implant 123 permits the channel region 116 to be doped after the gate electrode 106 is formed. Angle 124 of dopant ion implantation 123 is in the range between 30° and 70° from vertical sidewall 112 of gate electrode 106 adjoining source 120. Preferably, angle 124 is approximately 60°. Since a portion of silicon region 104 underlying gate 106 is shielded by gate 106 during implantation, channel region 116 has a length 118 less than the gate length 110. Further, the shielding by gate 106 results in the asymmetric placement of channel region 116 closer to source 120 than to drain 122. Drain region 122 is masked with resist 125, during ion implantation 123 to prevent the penetration of doping impurities into drain 122.

Channel region 116 is formed by implanting a dopant selected from the group consisting of phosphorus and arsenic. The ion dose in the range between $1\times10^{13}$ and $1\times10^{14}/cm^2$. The ion energy level is in the range between 10 keV and 100 keV when the dopant is phosphorus, and the ion energy level is in the range between 20 keV and 200 keV when the dopant is arsenic. An n-type channel region 116 is formed.

Alternately, a hybrid technique is used to form channel region 116, combining features of the present invention with a dopant diffusion technique. Tilted implantation 123 is performed with angle 124 being less than approximately 30° from vertical sidewall 112 of gate electrode 106, so that source 120 is doped, but channel 116 is only partially doped. That is, dopant implantation 123 doesn't extend completely into channel region 116 as shown in FIG. 8. Then, the dopant is permitted to diffuse into channel region 116 by heating transistor 100 to temperatures in the range between 850° and 1100° C. for a time in the range between 30 and 60 minutes. Thus, asymmetric channel region 116 results when angle 124 of ion implantation 123 is shallow.

Figure 9:
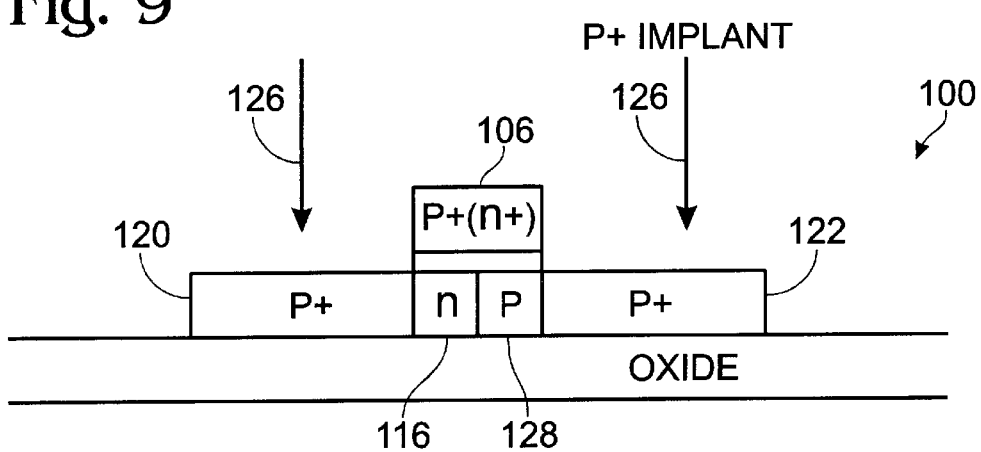

FIG. 9 is a partial cross-sectional view of transistor 100 of FIG. 8 with an ion implantation of dopant, represented by arrows 126, to form source 120 and drain 122. The p+ implantation 126 forms p+ source 120 and drain 122 regions. A p-type silicon drain extension 128 extends underneath gate 106 from channel region 116, to drain 122. Drain extension 128 is formed in an area underlying gate 106 that is typically a part of the channel region in prior art transistors. Gate electrode 106 shields drain extension 128 from angled ion implantation when channel region 116 is formed (FIG. 8). Gate electrode 106 also shields drain extension 128 from ion implantation when source 120 and drain 122 are doped p+. Drain extension 128 permits a large breakdown voltage to develop between channel 116 and drain 122 without the necessity of forming LDD regions, as in prior art transistors (see LDD region 32 of FIG. 3).

In the interest of brevity, an equivalent NMOS transistor is not shown. However, the structures and fabrication processes are essentially the same as those described above for PMOS transistor 100, and depicted in FIGS. 6–10. An n+ gate electrode is formed in an NMOS transistor. An angled ion implantation forms a short, asymmetric p-channel region. The channel region results from implanting a dopant selected from the group consisting of boron and $BF_2$. The ion dose is in the range between $1\times10^{13}$ and $1\times10^{14}/cm^2$. The ion energy level is in the range between 2 keV and 30 keV when the dopant is boron, and the ion energy level is in the range between 10 keV and 150 keV when the dopant is $BF_2$. The drain extension region remains n, while the source and drain are later doped to become n+.

As explained in the discussion of NMOS transistor 40 in FIG. 4, source 120, drain 122, channel 116, and drain extension 128 are formed in silicon from the group consisting of SIMOX and bulk silicon. After a few basic bulk silicon process steps, the transistors made from these different types of silicon are fabricated in essentially the same manner.

Figure 10:
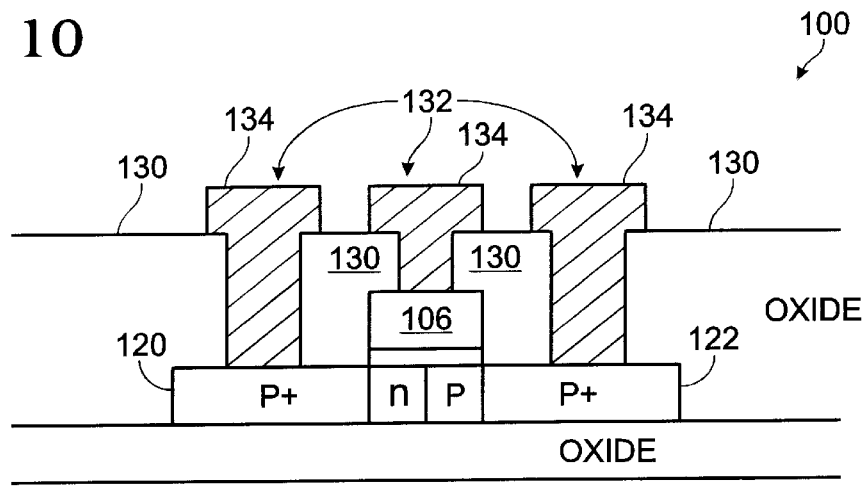

FIG. 10 is a partial cross-sectional view of transistor 100 of FIG. 9 further comprising a layer of oxide 130 over said source 120, drain 122, and gate 106 regions of transistor 100 with contact holes 132 through oxide 130, to source 120, drain 122, and gate 106 regions. Transistor 100 also comprises metal 134 in contact holes 132 to form independent electrical connections to source 120, drain 122, and gate 106. In this manner, transistor 100 interfaces with other electrical circuits (not shown).

Figure 11:
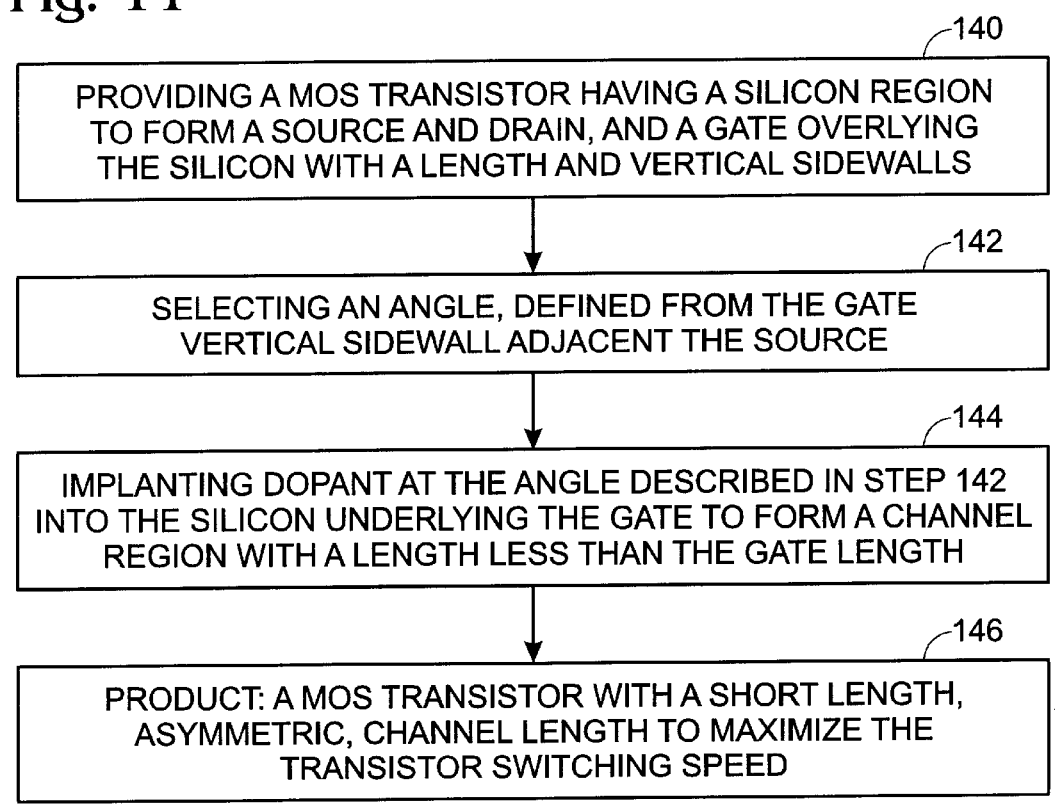
FIG. 11 is a flow chart illustrating steps in a method for forming a short, asymmetric channel region in the fabrication of a MOS transistor.

FIG. 11 is a flow chart illustrating steps in a method for forming a short length, asymmetric channel region underlying a gate electrode in the fabrication of a MOS transistor. Step 140 provides a MOS transistor having an isolated silicon region to form a source, a drain, and a gate electrode overlying the silicon region. The gate electrode has a length extending from the source to the drain. The gate electrode also has vertical sidewalls adjoining the source and drain. Step 142 selects an angle, defined from the vertical sidewall of the gate electrode adjacent the source region. In one aspect of the invention, Step 142 includes the selected angle being in the range between 30° and 70° from the vertical sidewall of the gate electrode. The definition of the ion implantation angle with respect to the vertical sidewall is arbitrary and based on the observation that the gate sidewalls of the gate are typically perpendicular to the horizontal plane surface of the source. Alternately, the ion implantation angle is defined from the horizontal plane surface of the source, or from other convenient references.

Step 144 implants ions of a dopant, at the angle defined in Step 142, into the silicon region underlying the gate electrode adjacent the source, to form a channel region with a length less than the gate electrode length. The channel region length extends from underneath the vertical sidewall of the gate electrode adjacent the source region, toward the drain region. Step 146 is a product, a MOS transistor with a short length, asymmetric channel region underlying the gate electrode. The short channel length maximizes the transistor switching speed. The method depicted in FIG. 11 corresponds approximately with transistor 100 of FIG. 8.

FIG. 12 is a more detailed depiction of the flow chart of FIG. 11, illustrating the method of the present invention for forming a short, asymmetric channel region. Step 150 provides a MOS transistor selected from the group consisting of NMOS and PMOS transistors. Step 152 isolates a region of silicon, from which a source, a drain, and a channel region between the source and drain, are subsequently formed, and the region is doped. When a NMOS transistor is formed, the region is doped to form a shallow n-junction. When a PMOS transistor is formed, the region is doped to form a shallow p-junction. In one aspect of the invention, the silicon region is implanted with ions of a first dopant at a first doping density. Step 154 forms a gate electrode overlying the silicon region. The gate electrode has a length extending from the source to the drain, and vertical sidewalls adjoining the source and drain. In one aspect of the invention, Step 154 includes forming a gate electrode having a length of less than approximately 0.5 microns.

Step 156 implants ions of dopant at a predetermined angle, defined from the gate electrode vertical sidewall adjacent the source, into the silicon region underlying the gate to form a channel region having a length less than the gate length. The channel region extends from underneath the gate electrode vertical sidewall adjacent the source, toward the drain. Step 156 includes implanting a second dopant at a second doping density and second ion energy level. Another aspect of the invention includes Step 156 using an ion implantation angle in the range between 30° and 70° from the vertical sidewall of the gate electrode. Preferably the angle is approximately 60°. Step 158 is a product, a MOS transistor with a short, asymmetric channel region. The short channel length maximizes the transistor switching speed.

Alternately, step 156 uses a shallower implantation angle, less than approximately 30°, as defined in Step 156, above. Then, the method includes an additional step of heating the transistor to temperatures in the range between 850° and 1100° C. for a time in the range between 30 and 60 minutes to diffuse the dopant implanted in Step 156. An asymmetric channel is formed when the angle of implantation is shallow.

One aspect of the invention includes additional steps. Step 160, following Step 156, implants a third dopant at a third doping density and third ion energy level, to form source and drain regions. Step 162 deposits a layer of oxide over the source, drain, and gate regions of the transistor. The Step forms contact holes through the oxide, to the source, drain, and gate regions, and deposits metal in the contact holes forming independent electrical connections to the source, drain, and gate. Alternately, Step 162 is broken up into sub-steps of depositing oxide, forming contact holes, and depositing metal.

One aspect of the invention includes an additional Step 164, after Step 154, of masking the drain region to prevent the implantation of dopant ions during Step 156. The placement and thickness of the resist, or other masking agent, is dependent on a variety of factors including the implantation angle selected in Step 156, the sensitivity of the drain to dopants, and surrounding structures. In some aspects of the invention, the mask completely covers the drain, and at least partially covers the gate electrode to insure that none of the angle implant ions penetrate the drain and drain extension. In other variations, the drain is only partially masked, when the implantation angle and geometry of the drain insure that ions will not penetrate through the gate to the drain extension region.

In one aspect of the invention, the MOS transistor provided in Step 150 is selected from the group of an NMOS transistors. Then, Step 152 includes a first dopant selected from the group consisting of phosphorus and arsenic. The first doping density in the range between $1\times10^{15}$ and $1\times10^{17}/$cm$^3$. In this manner, an n-doped silicon region is formed. Likewise, Step 156 includes a second dopant selected from the group consisting of boron and BF$_2$. The second ion dose is in the range between $1\times10^{13}$ and $1\times10^{14}$/cm$^2$. The second ion energy level is in the range between 2 keV and 30 keV when the second dopant is boron, and the second ion energy level is in the range between 10 keV and 150 keV when the second dopant is BF$_2$. In this manner, a short p-channel region is formed. Finally, Step 160 includes the third dopant being selected from the group consisting of phosphorus and arsenic. The third ion dose is in the range between $1\times10^{15}$ and $1\times10^{16}$/cm$^2$. The third ion energy level is in the range between 5 keV and 20 keV when the third dopant is phosphorus, and the third ion energy level is in the range between 10 keV and 40 keV when the third dopant is arsenic. In this manner, n+ source and drain regions are formed.

In another aspect of the invention, Step 150 provides (p+ gate and n+ gate) PMOS transistors. Step 152 includes using boron as the first dopant at a first doping density in the range between $1\times10^{15}$ and $1\times10^{17}$/cm$^3$. A p-doped silicon region is formed. Likewise, Step 156 includes a second dopant selected from the group consisting of phosphorus and arsenic. The second ion dose is in the range between $1\times10^{13}$ and $1\times10^{14}$/cm$^2$. The second ion energy level is in the range between 10 keV and 100 keV when the second dopant is phosphorus, and the second ion energy level is in the range between 20 keV and 200 keV when the second dopant is arsenic. A short n-channel region is formed. Finally, Step 160 includes the third dopant being selected from the group consisting of BF$_2$ and boron. The third ion dose is in the range between $1\times10^{15}$ and $1\times10^{16}$/cm$^2$. The third ion energy level is in the range between 10 keV and 50 keV when the third dopant is BF$_2$, and the third ion energy level is in the range between 2 keV and 10 keV when the third dopant is boron. p+ source and drain regions are formed.

As explained above in the description of FIGS. 4 and 5, Step 152 includes forming the silicon region to be doped from the group consisting of bulk silicon and SIMOX. In the interest of brevity, the differences between the two methods will not be repeated, and it is understood that the method of the present invention is applied to transistors formed from bulk silicon and SIMOX. That is, Step 152 includes isolating and p-doping an area of silicon overlying an n-well in p-type bulk silicon, when a PMOS transistor is formed. Alternately, an area in n-type bulk silicon is isolated and doped. When an NMOS transistor is formed, Step 152 includes isolating and n-doping an area of silicon overlying a p-well in n-type bulk silicon. Alternately, an area in p-type bulk silicon is isolated and doped. Once the region of silicon which form the source, drain, channel and drain extension regions is isolated, the present invention is applicable to both sources of silicon despite minor variations in process steps or structures. The present invention of an tilted ion implantation eliminates the LDD region between the source and channel region. This gives a transistor made by the process of the present invention a smaller drain-to-source resistance. The larger drain extension area permits a larger breakdown voltage, and the shorter channel permits larger drain currents. This smaller resistance and larger drain current make the device switching speeds faster. Further, the elimination of LDD regions eliminates at least one step of doping and the need to form gate sidewalls overlying the LDD regions. The elimination of process steps increases manufacturing throughput and lowers fabrication costs. Other embodiments and variations of the present invention for forming a channel region through tilted angle implantation will occur to those skilled in the art.

What is claimed is:

1. In the fabrication of a MOS transistor selected from the group consisting of NMOS and PMOS transistors, a method for forming a short, asymmetric channel region comprising the steps of:
   a) isolating a region of silicon, from which a source, a drain, and a channel region between the source and drain, are subsequently formed, and doping the region to be n-doped for an NMOS transistor, and p-doped for a PMOS transistor whereby a drain extension is prepared to underlie a gate subsequently formed;
   b) forming the gate electrode overlying the silicon region, the gate electrode having a length extending from the source to the drain, and vertical sidewalls adjoining the source and drain; and
   c) implanting ions of dopant at a predetermined angle, defined from the gate electrode vertical sidewall adjacent the source, into the silicon region underlying the gate to form a channel region having a length less than the gate length, the channel region extending from underneath the gate electrode vertical sidewall adjacent the source, toward the drain, whereby the formation of a short channel length maximizes the transistor switching speed.

2. A method as in claim 1 in which the doping of step a) includes implanting ions of a first dopant at a first doping density, in which step c) includes implanting a second dopant at a second ion dose and second ion energy level, and including further steps, following step c), of:
   d) implanting a third dopant at a third ion dose and third ion energy level, to form source and drain regions;
   e) depositing a layer of oxide over the source, drain, and gate regions of the transistor;
   f) forming contact holes through the oxide deposited in step e), to the source, drain, and gate regions; and
   g) depositing metal in the contact holes, forming independent electrical connections to the source, drain, and gate.

3. A method as in claim 1 comprising the additional step, after step b), of:
   h) masking the drain region to prevent the implantation of dopant ions during step c).

4. A method as in claim 1 in which step c) includes using an ion implantation angle in the range between 30° and 70° from the vertical sidewall of the gate electrode adjoining the source.

5. A method as in claim 4 in which the ion implantation angle is approximately 60°.

6. A method as in claim 1 in which step a) includes forming the silicon region to be doped from the group consisting of bulk silicon and SIMOX.

7. A method as in claim 1 including the further step, following step c), of:

i) heating the transistor to a temperature in the range between 850° and 1100° C., for a time in the range between 30 minutes and 60 minutes to diffuse the dopant implanted in step c), whereby an asymmetrical channel is formed when the angle of implantation is shallow.

8. A method as in claim 1 in which step b) includes forming a gate electrode having a length of less than approximately 0.5 microns.

9. A method as in claim 2 wherein the MOS transistor is an NMOS transistor, and in which step a) includes a first dopant selected from the group consisting of phosphorus and arsenic, and in which the first doping density in the range between $1\times10^{15}$, and $1\times10^{17}/cm^3$, whereby an n-doped silicon region is formed.

10. A method as in claim 9 in which step c) includes a second dopant selected from the group consisting of boron and $BF_2$, in which the second ion dose is in the range between $1\times10^{13}$ and $1\times10^{14}/cm^2$, in which the second ion energy level is in the range between 2 keV and 30 keV when the second dopant is boron, and in which the second ion energy level is in the range between 10 keV and 150 keV when the second dopant is $BF_2$, whereby a short p-channel region is formed.

11. A method as in claim 10 in which step d) includes the third dopant being selected from the group consisting of phosphorus and arsenic, in which the third ion dose is in the range between $1\times10^{15}$ and $1\times10^{16}/cm^2$, in which the third ion energy level is in the range between 5 keV and 20 keV when the third dopant is phosphorus, and in which the third ion energy level is in the range between 10 keV and 40 keV when the third dopant is arsenic, whereby n+ source and drain regions are formed.

12. A method as in claim 2 wherein the MOS transistor is a PMOS transistor, and in which step a) includes using boron as the first dopant at a first doping density in the range between $1\times10^{15}$ and $1\times10^{17}/cm^3$, whereby a p-doped silicon region is formed.

13. A method as in claim 12 in which step c) includes a second dopant selected from the group consisting of phosphorus and arsenic, in which the second ion dose is in the range between $1\times10^{13}$ and $1\times10^{14}/cm^2$, in which the second ion energy level is in the range between 10 keV and 100 keV when the second dopant is phosphorus, and in which the second ion energy level is in the range between 20 keV and 200 keV when the second dopant is arsenic, whereby a short n-channel region is formed.

14. A method as in claim 13 in which step d) includes the third dopant being selected from the group consisting of $BF_2$ and boron, in which the third ion dose is in the range between $1\times10^{15}$ and $1\times10^{16}/cm^2$, in which the third ion energy level is in the range between 10 keV and 50 keV when the third dopant is $BF_2$, and in which the third ion energy level is in the range between 2 keV and 10 keV when the third dopant is boron, whereby p+ source and drain regions are formed.

15. In the fabrication of a MOS transistor selected from the group consisting of NMOS and PMOS transistors, a method for forming a short, asymmetric channel region comprising the steps of:
   a) forming a drain extension region by isolating a region of silicon, from which a source, a drain, and a channel region between the source and drain, are subsequently formed, and doping the region to be n-doped for an NMOS transistor, and p-doped for a PMOS transistor, whereby electric fields are distributed more evenly and a large breakdown voltage is achieved;

b) forming a gate electrode overlying the silicon region, the gate electrode having a length extending over the drain extension from the source to the drain, and vertical sidewalls adjoining the source and drain; and c) implanting ions of dopant at a predetermined angle, defined from the gate electrode vertical sidewall adjacent the source, into the silicon region underlying the gate to form a channel region having a length less than the gate length, the channel region extending from underneath the gate electrode vertical sidewall adjacent the source, toward the drain to the adjacent drain extension region, whereby the formation of a short channel length maximizes the transistor switching speed.

16. A method as in claim 15 in which step c) includes selecting an angle in the range between 30° and 70° from the vertical sidewall of the gate electrode adjacent the source region.

* * * * *